(12) United States Patent
Kawasumi et al.

(10) Patent No.: US 8,077,499 B2
(45) Date of Patent: Dec. 13, 2011

(54) SEMICONDUCTOR INTEGRATED MEMORY CIRCUIT AND TRIMMING METHOD THEREOF

(75) Inventors: Atsushi Kawasumi, Kawasaki (JP); Yukihiro Urakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 12/540,022

(22) Filed: Aug. 12, 2009

(65) Prior Publication Data

US 2010/0054025 A1 Mar. 4, 2010

(30) Foreign Application Priority Data

Aug. 26, 2008 (JP) ................................. 2008-216198

(51) Int. Cl.
*G11C 11/00* (2006.01)
(52) U.S. Cl. ................ 365/154; 365/189.05; 365/205
(58) Field of Classification Search .................. 365/154, 365/189.05, 205
See application file for complete search history.

(56) References Cited

U.S. PATENT DOCUMENTS

| | | | |
|---|---|---|---|
| 6,584,026 B2 | 6/2003 | Kawasumi | |
| 7,477,560 B2 | 1/2009 | Kawasumi | |
| 2005/0099871 A1* | 5/2005 | Itaka | 365/222 |
| 2005/0213371 A1* | 9/2005 | Kimura | 365/154 |

FOREIGN PATENT DOCUMENTS

| | | |
|---|---|---|
| JP | 6-76582 | 3/1994 |
| JP | 10-162585 | 6/1998 |
| JP | 2000-311491 | 11/2000 |
| JP | 2003-45190 | 2/2003 |
| JP | 2004-127499 | 4/2004 |
| JP | 2005-276315 | 10/2005 |
| JP | 2005-353106 | 12/2005 |

OTHER PUBLICATIONS

Office Action issued Nov. 2, 2010, in Japanese Patent Application No. 2008-216198, (with English translaton).
Office Action (with English translation) issued on Aug. 2, 2011, in counterpart Japanese Application No. 2008-216198 (6 pages).

* cited by examiner

*Primary Examiner* — Huan Hoang
(74) *Attorney, Agent, or Firm* — Oblon, Spivak, McClelland, Maier & Neustadt, L.L.P.

(57) ABSTRACT

A latch circuit includes first and second inverters connected in a cross-coupling manner at a first node and a second node. A voltage application circuit applies a hot carrier generation voltage for generating hot carrier at a transistor included in the first inverter or the second inverter. An inverting circuit generates an inversion signal as an inverted signal of an amplified signal provided from the latch circuit to the bit line pair to provide the inversion signal to the first node and the second node.

19 Claims, 8 Drawing Sheets

SEMICONDUCTOR INTEGRATED MEMORY CIRCUIT AND TRIMMING METHOD THEREOF

CROSS REFERENCE TO RELATED APPLICATIONS

This application is based on and claims the benefit of priority from prior Japanese Patent Application No. 2008-216198, filed on Aug. 26, 2008, the entire contents of which are incorporated herein by reference.

BACKGROUND OF THE INVENTION

1. Field of the Invention

The present invention relates to a semiconductor integrated memory circuit, and particularly to a device for trimming variation in threshold voltage of a latch circuit. Moreover, the present invention relates to a trimming method of the threshold voltage using such a device.

2. Description of the Related Art

An access speed of a semiconductor integrated memory circuit such as SRAM is greatly affected by the operation speed of the sense amplifier, as well as by the operation speed of the memory cell. The sense amplifier generally employs a structure with MOS transistors, from the viewpoint of low power consumption. The sense amplifier comprises a latch circuit constructed by MOS transistors.

However, the semiconductor memory element having a sense amplifier composed of MOS transistors has a large variation in threshold voltage of the sense amplifier. Also, the operation of the sense amplifier is delayed until the signal levels on the bit line increase larger than an offset thereof. This is regarded as a problem of such a semiconductor memory device. Moreover, a latch circuit formed of MOS transistors is included in an SRAM cell. An offset in such the latch circuit may affect the reading speed.

The following method has been proposed to solve the above-mentioned problem. That is, in a known method, a means for trimming an offset is introduced in the semiconductor integrated memory circuit, and a voltage suitable for the amount of trimming is applied to the MOS transistors included in the sense amplifier circuit. This method is described in JP 10-162585A. However, the method requires a trimming means and trimming adjustment unit to be formed in the device in addition to the sense amplifier. This increases the area of the semiconductor integrated memory circuit. In addition, this method is advantageous because trimming suitable for the offsets of plural sense amplifiers. However, it takes a lot of time to finish trimming for all the sense amplifier circuits or the like in the semiconductor integrated memory device because it requires adjustment for respective sense amplifier circuits.

Therefore, the conventional art has difficulty in providing a semiconductor integrated memory circuit that may trim the offset of the sense amplifier circuit with high efficiency while requiring a smaller area.

SUMMARY OF THE INVENTION

The semiconductor integrated memory circuit according to one aspect of the present invention comprises:

a bit line pair comprising a first bit line and a second bit line;

a latch circuit including first and second inverters connected in a cross-coupling manner at a first node and a second node;

a voltage application circuit operative to apply a hot carrier generation voltage for generating hot carrier at a transistor included in the first inverter or the second inverter;

an inverting circuit operative to generate an inversion signal as an inverted signal of an amplified signal provided from the latch circuit to the bit line pair to provide the inversion signal to the first node and the second node.

The method of trimming a latch circuit in a semiconductor integrated memory circuit according to one aspect of the present invention includes the latch circuit including first and second inverters connected in a cross-coupling manner at a first node and a second node.

The method comprises:

generating an inversion signal by inverting an amplified signal supplied from the latch circuit to a bit line pair;

supplying the inversion signal to the first node and the second node; and applying a hot-carrier generation signal for generating hot carrier in a transistor included in the latch circuit.

DETAILED DESCRIPTION OF THE EMBODIMENTS

Next, a semiconductor integrated memory circuit according to an embodiment of the present invention will be described with reference to attached drawings.

First Embodiment

First, the first embodiment of the present invention is explained with reference to FIG. 1A and FIG. 1B.

Figure 1A:
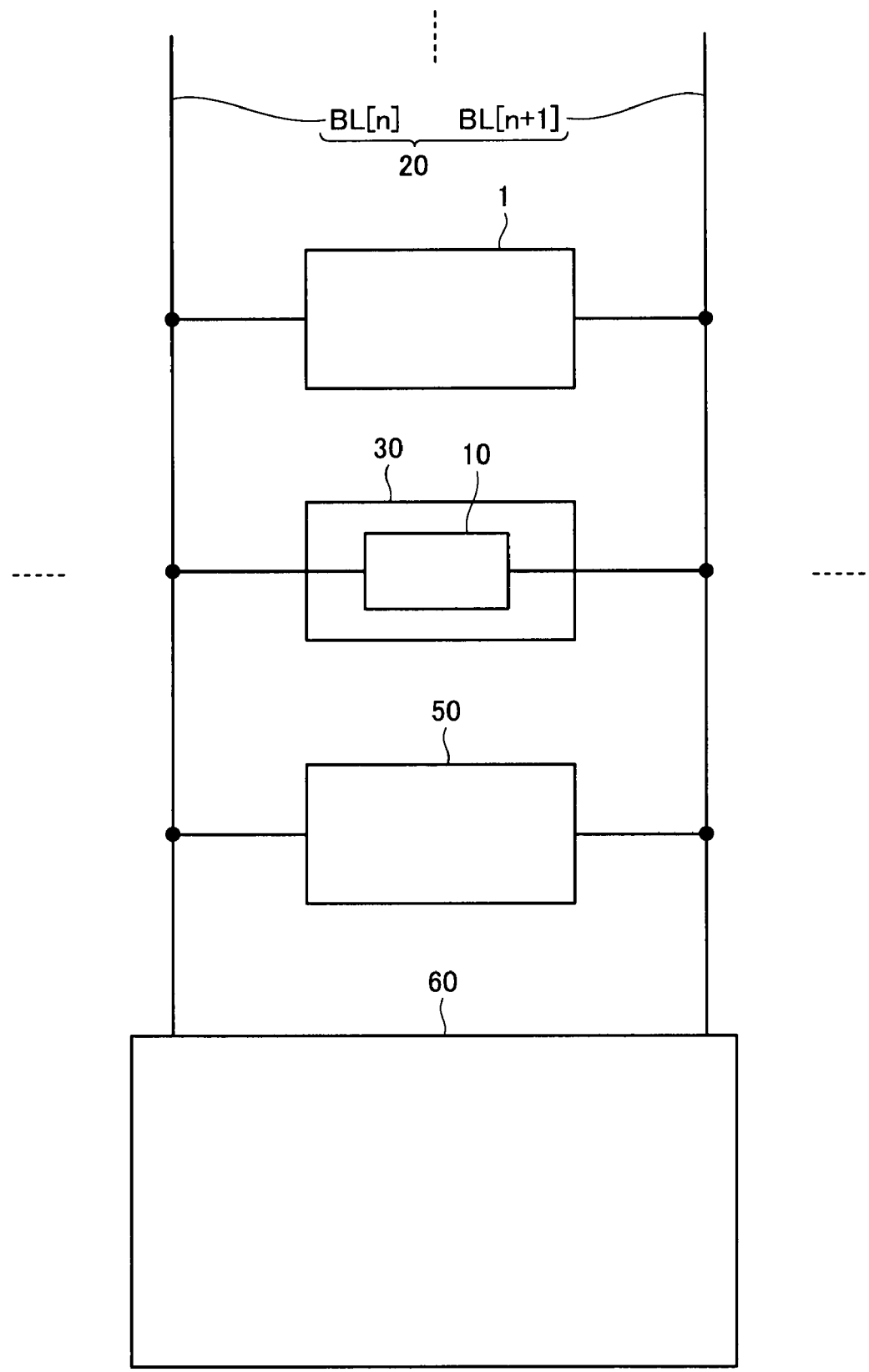
FIG. 1A is a block diagram illustrating an entire structure of SRAM according to the first embodiment of the present invention.

FIG. 1A is a schematic view illustrating an entire structure of the semiconductor integrated memory circuit (SRAM) according to the first embodiment of the present invention. This SRAM includes a first circuit 30 and an inverting circuit 50. The first circuit 30 includes a sense amplifier circuit 10 formed therein.

Figure 1B:
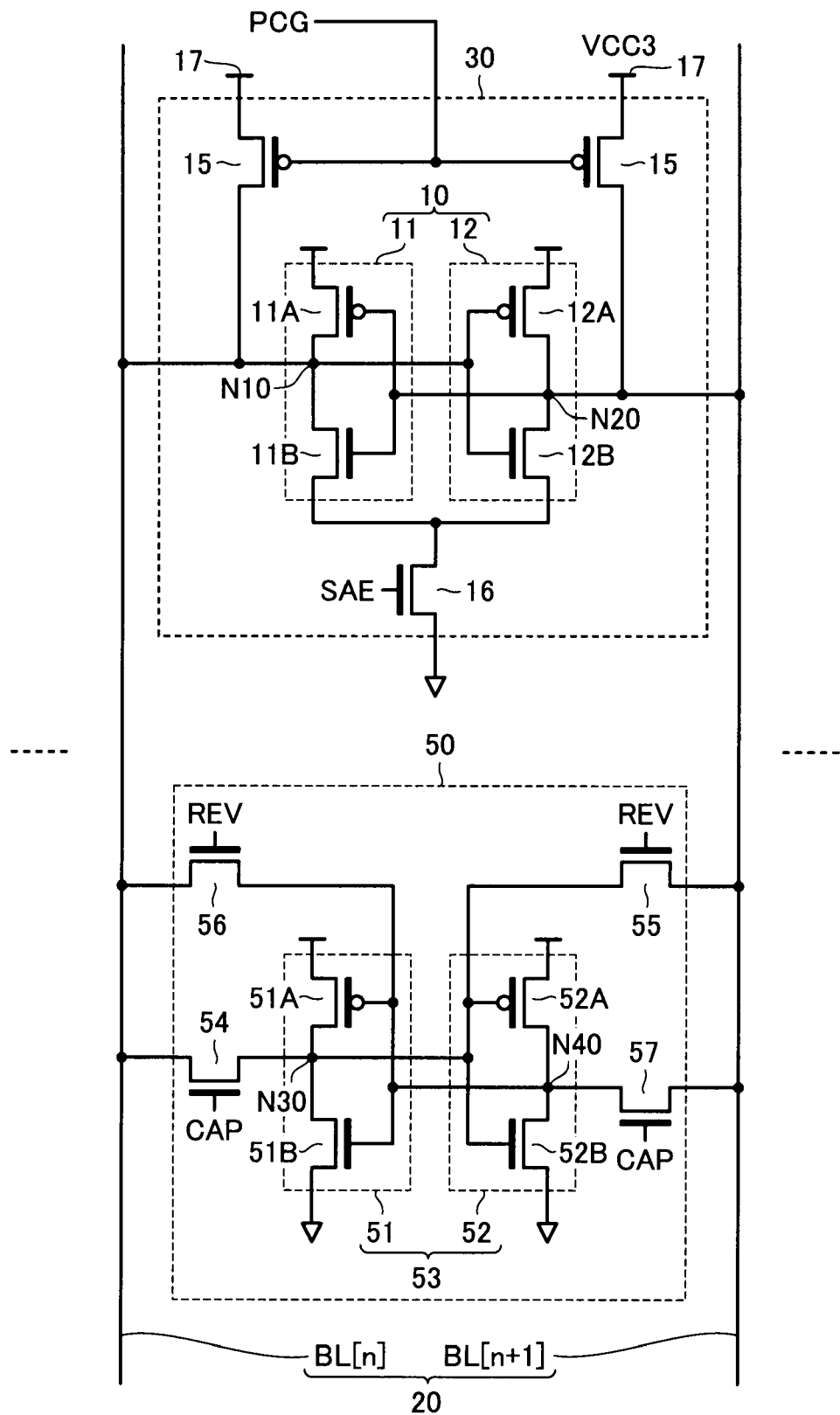
FIG. 1B is a figure illustrating a structure of a sense amplifier circuit and an inverting circuit in SRAM according to the first embodiment of the present invention.

Moreover, FIG. 1B is a figure illustrating a structure of the first circuit 30 and the inverting circuit 50.

As shown in FIG. 1A, this SRAM compares and amplifies data read from a plurality of SRAM memory cells 1 arranged therein at the sense amplifier circuit 10 in the first circuit 30. The data is transferred to the output buffer 60.

The inverting circuit 50 performs, in such an SRAM, trimming of the sense amplifier circuit. More particularly, it modifies variation (offset) of the threshold voltages of nMOS transistors included in the sense amplifier circuits 10.

Moreover, the first circuit 30 comprises, in addition to the sense amplifier circuit 10, transistors 15 that function as a voltage application circuit used for performing trimming.

Although FIG. 1A and FIG. 1B illustrate only one bit line pair, the number of the bit line pairs and the number of the sense amplifier circuits 10 connected to the bit line pairs are not limited to the present embodiment.

As shown in FIG. 1B, a circuit 30 including the sense amplifier circuit 10 and the inverting circuit 50 are connected to the common bit line pair 20 (a bit line BL [n] and a bit line BL [n+1]).

The sense amplifier circuit 10 includes inverters 11 and 12. These inverters are connected in a cross-coupling manner at nodes N10 and N20. The inverter 11 includes a pMOS transistor 11A and an nMOS transistor 11B that are connected so that their current paths are serially connected. In addition, these transistors have commonly-connected gates. The inverter 12 includes a pMOS transistor 12A and an nMOS transistor 12B that are connected so that their current paths are serially connected. In addition, these transistors have commonly-connected gates.

Moreover, the sense amplifier circuit 10 has nodes N10 and N20. These nodes N10 and N20 are connected to the bit line pairs 20 comprising the bit line BL [n] and the bit line BL [n+1]. In other words, the output terminal of the inverter 11 and the input terminal of the inverter 12 are connected to the node N10, and the bit line BL [n] is connected to the node N10. The output terminal of the inverter 12 and the input terminal of the inverter 11 are connected to the node N20, and the bit line BL [n+1] is connected the node N20.

The pair of the pMOS transistors 15 have drains connected to the node N10 and N20, respectively. The PMOS transistor 15 precharges the bit line pair 20, before reading from the memory cell 1.

Moreover, the pMOS transistor 15 becomes conductive when hot carrier is to be generated at the nMOS transistors 11B and 12B included in the inverters 11 and 12 in the sense amplifier circuit 10.

Moreover, a power supply terminal 17 is connected to the source of the pMOS transistor 15. The power supply terminal 17 is provided with a high voltage VCC3 (1.4 V) that is necessary for generating hot carrier.

Moreover, an nMOS transistor 16 is connected between sources of nMOS transistor 11B and 12B included in the inverter 11 and 12, respectively, and a ground terminal, so that a current path thereof is formed therebetween.

The pMOS transistor 15 has a gate connected to a signal line PCG. The signal line PCG is provided with a voltage for turning on the pMOS transistors 15 when hot carrier is to be generated. Moreover, a signal line SAE is connected to a gate of the nMOS transistor 16.

The signal line SAE is provided with a voltage for turning on the nMOS transistor 16 when the sense amplifier circuit 10 is to be set in an active state. The inverting circuit 50 includes a latch circuit 53. The latch circuit 53 includes inverters 51 and 52 that are connected in a cross-coupling manner at nodes N30 and N40.

The inverter 51 is formed by connecting a pMOS transistor 51A and an nMOS transistor 51B so that their current paths are connected in series. The transistors 51A and 51B include respective gates connected to the node N40.

On the other hand, the inverter 52 is formed by connecting a pMOS transistor 52A and an nMOS transistor 52B so that their current paths are connected in series. The transistors 52A and 52B include respective gates connected to the node N30.

The node N30 is connected to the output terminal of the inverter 51 and to the input terminal of the inverter 52. An nMOS transistor 54 is connected between the node N30 and the bit line BL [n]. Moreover, an nMOS transistor 55 is connected between the node N30 and the bit line BL [n+1].

Moreover, the node N40 is connected to the output terminal of the inverter 52 and to the input terminal of the inverter 51. An nMOS transistor 56 is connected between the node N40 and the bit line BL [n]. Moreover, an nMOS transistor 57 is connected between the node N40 and the bit line BL [n+1].

The nMOS transistor 54 and 57 are turned on when the latch circuit 53 receives amplified signals emerged on the bit line pair 20 caused by the sense amplifier circuit 10.

In addition, a Signal line CAP is connected to gates of the transistors 54 and 57. The signal line CAP is provided with a capture instructing signal for instructing capturing at the latch circuit 53. Moreover, the transistors 55 and 56 have respective gates connected to a signal line REV. The signal line is provided with a reverse signal for instructing a supply of the inverted signal.

Note that the signal line REV may be connected to the gates of the transistors 54 and 57, and the signal line CAP may be connected to the gates of the transistors 55 and 56.

[Operation of First Embodiment]

Then, the operation of the SRAM according to the first embodiment is described with reference to FIG. 2. Here, operation for trimming the sense amplifier circuit 10 is explained using FIG. 2.

Figure 2:
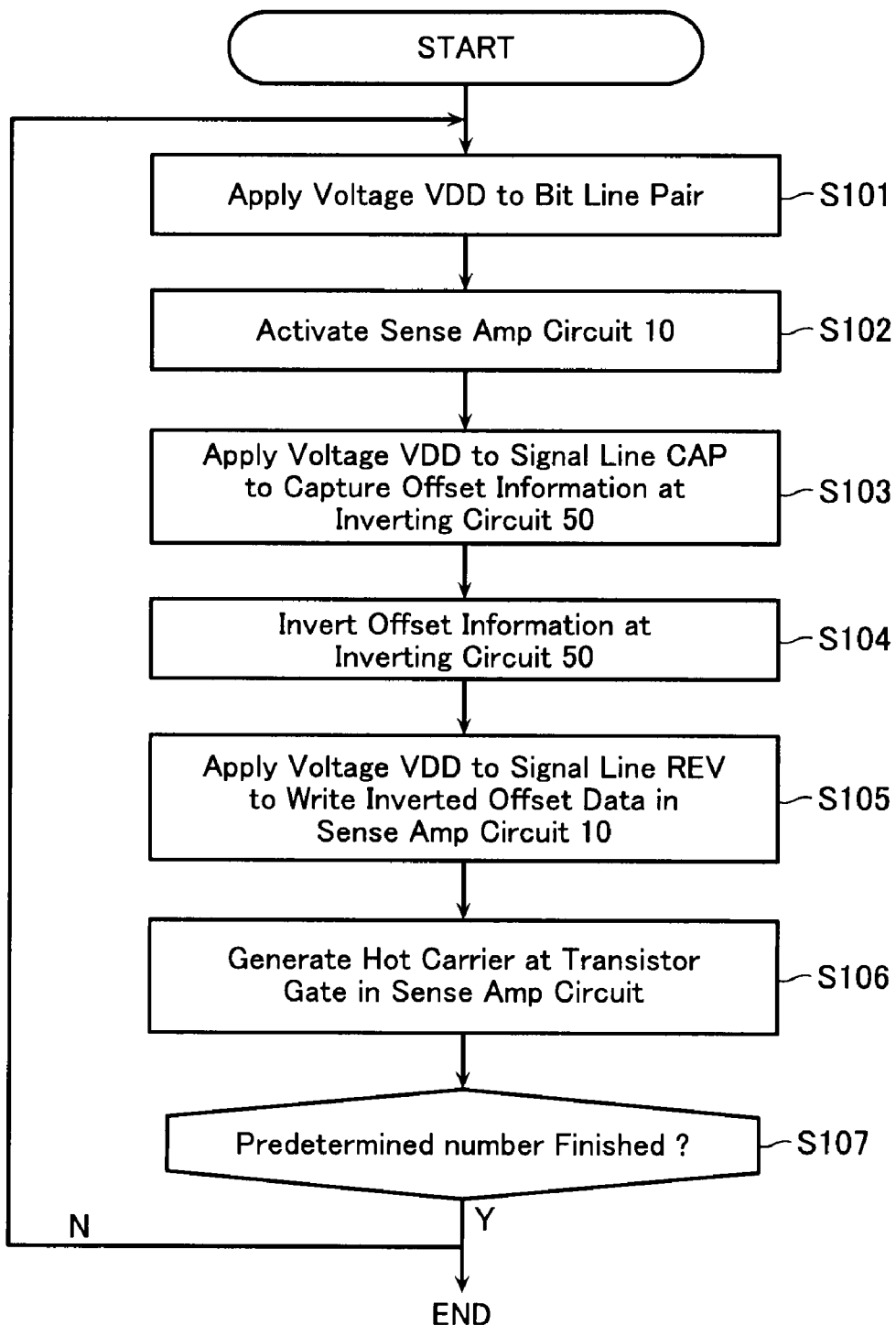
FIG. 2 is a flowchart illustrating an example of the trimming process of the sense amplifier circuit performed in the SRAM.
Figure 3:
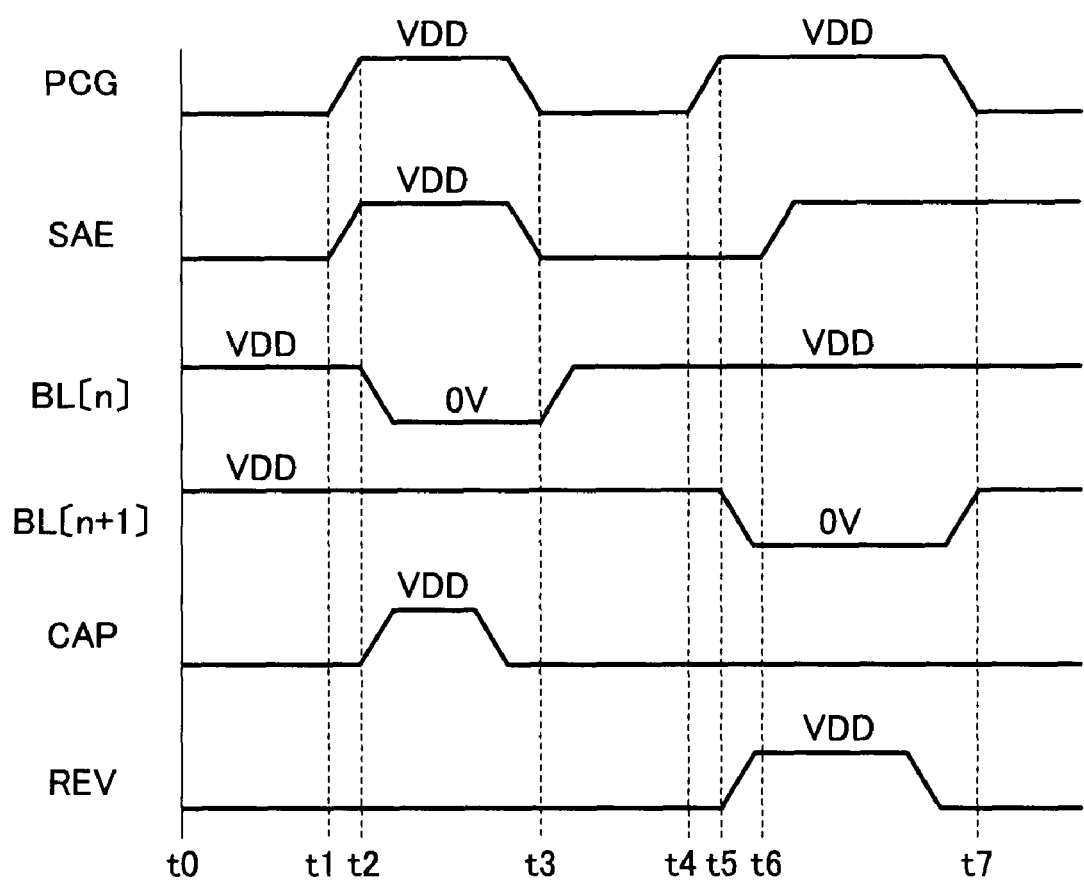
FIG. 3 is a timing-chart of a trimming process of the sense amplifier circuit in the SRAM.

FIG. 2 is a flowchart showing an example of the trimming method of the sense amplifier circuit 10 performed in the SRAM. FIG. 3 is a timing chart showing each of the steps.

In this example explained below, it is assumed that a threshold voltage of the nMOS transistor 11B included in the inverter 11 is small. Therefore, hot carrier is generated at the nMOS transistor 11B to adjust a threshold voltage of the nMOS transistor 11B.

In the trimming method of the sense amplifier circuit 10, the voltage of the signal line PCG is set at 0 V at the time t0 in order to acquire offset information of the sense amplifier circuit 10. The pMOS transistor 15 is turned on, and a voltage VDD is applied (precharged) to the bit line pair 20 (the bit lines BL [n] and BL [n+1]) (Step S101).

Then, at the time t1, the voltage of the signal line PCG is again set at the voltage VDD to finish the precharge operation of the bit line pair 20. In addition, the voltage VDD is applied to the signal line SAE to activate the sense amplifier circuit 10 (Step S102).

This causes the nMOS transistor 11B, which has a lower threshold voltage than others, to be in a conductive state, thereby obtaining offset information "0" at the node N10. On the contrary, offset information "1" is obtained at the node N20. Then, offset information "0" is supplied to the bit line BL [n], while offset information "1" (the voltage VDD) is supplied to the bit line BL [n+1].

Next, at the time t2, the voltage VDD is applied to the signal line CAP. This allows the offset information (amplified signals) output to the bit line pair 20 to be supplied to the inverting circuit 50 (Step S103). If offset information (the amplified signals) is supplied to the inverting circuit 50, application of the voltage VDD to the signal line CAP is finished. Then, the inverting circuit 50 reverses or inverts the offset information supplied thereto, to generate the inverted data (inverted signals, or offset information)(Step S104).

When the inverted data is generated in this way in the inverting circuit 50, the voltage of the signal line PCG is reset from the voltage VDD to 0V at the time t3, and then the bit line pair 20 is precharged to the voltage VDD again.

At the time t4, the voltage of the signal line PCG is again set at the voltage VDD, thereby terminating the pre-charge operation. Thereafter, at the time t5, the voltage VDD is applied to the signal line REV to output the inverted data stored in the inverting circuit 50 to the bit line pair 20. The inverted data (offset information) supplied to the bit line pair 20 is transferred to the nodes N10 and N20 in the sense amplifier circuit 10 (Step S105).

Subsequently, the voltage of the signal line SAE is set at the voltage VDD at the time t6, thereby activating the sense amplifier circuit 10. This causes the voltage VCC3 (1.4 V) to be applied to the drain (the node N10) of the nMOS transistor 11B which stores offset information "0", and the voltage VCC3/2 to be applied to its gate. Moreover, the voltage VCC3/2 is applied to the drain (the node N20) of the nMOS transistor 12B which stores offset information "1", while the voltage VCC3 (1.4 V) is applied to its gate.

Hot carrier is thereby injected into the gate insulating film of the nMOS transistor 11B (Step S106). Note that the hot carrier is likely to occur when a high voltage VCC3 (1.4 V) is applied to the drain of the nMOS transistor 11B, while a voltage lower than the voltage VCC3 (e.g., VCC3/2) is applied to the gate thereof.

However, the high voltage VCC3 (1.4 V) needs to be higher than the voltage normally used in the nMOS transistor. Therefore, the nMOS transistor 11B storing offset information "0" meets the above-mentioned requirements, and thus is in a state that the hot carrier is likely to be injected to its gate oxide film. On the contrary, because the nMOS transistor 12B storing offset information "1" does not meet the above-mentioned requirements, and thus its state does not change.

The process returns to Step S101 for a predetermined number of times, and the same steps described above are repeated for the predetermined number of times. If the certain number of repetitions is completed, the trimming process is finished (Step S107).

The above-mentioned steps are performed for injecting hot carrier into the gate oxide film only at the nMOS transistor 11B (in other words, the nMOS transistor 11B having a lower threshold voltage) that stores offset information "0". Injecting hot carrier to the gate oxide film causes the threshold voltage to be raised. This may lower the difference or variation of the threshold voltages of the nMOS transistor 11B included in the inverter 11 and those of the nMOS transistor 12B included in the inverter 12.

Second Embodiment

Next, the second embodiment of the present invention is described with reference to FIG. 4.

Figure 4:
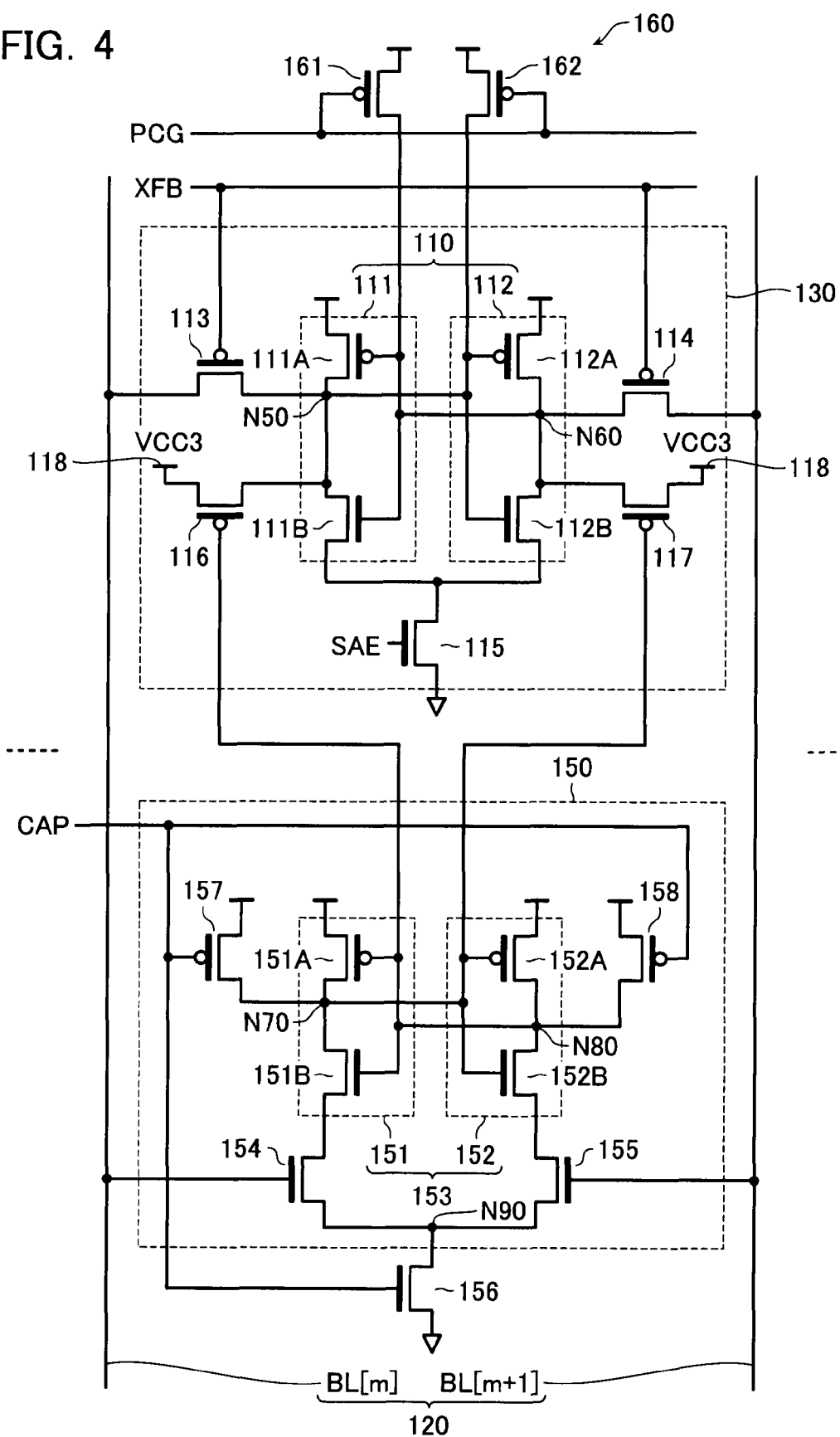
FIG. 4 is a figure illustrating a structure of the sense amplifier circuit and the inverting circuit in the SRAM according to the second embodiment of the present invention.
Figure 5:
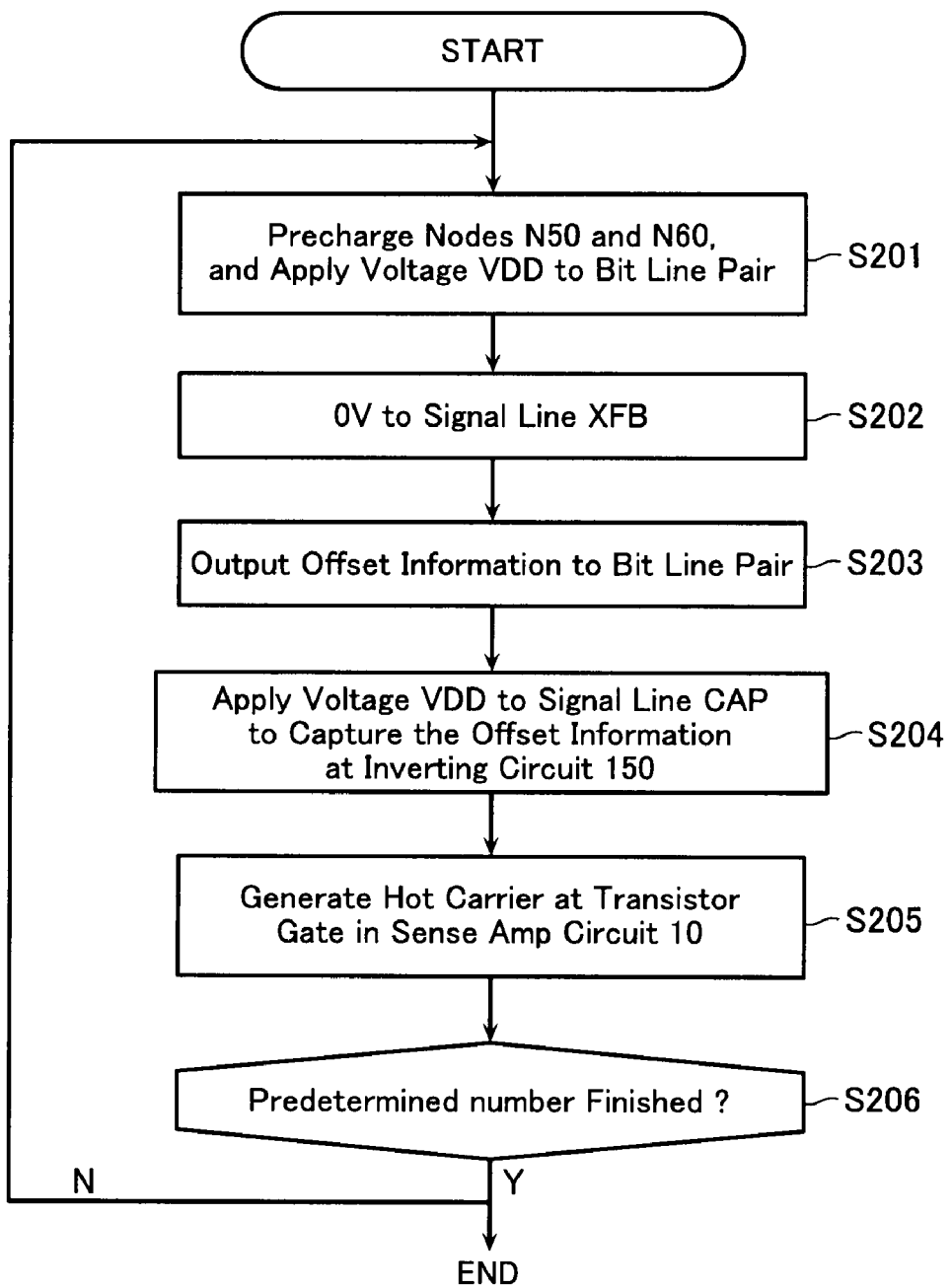
FIG. 5 is a flowchart showing an example of the trimming process of the sense amplifier circuit performed in the SRAM according to the second embodiment of the present invention.

FIG. 4 is a figure illustrating structures of the first circuit 130 including a sense amplifier circuit 110 and the inverting circuit 150 each formed in the SRAM according to the second embodiment of the present invention. As in the first embodiment, in the SRAM according to the second embodiment, the sense amplifier circuit 110 in the first circuit 130 compares and amplifies data read from a plurality of the SRAM memory cells 1 arranged therein. The amplified data is transferred to the output buffer 60 (not shown in FIG. 4).

The inverting circuit 150 is prepared for performing trimming for the sense amplifier circuit 110.

Moreover, the first circuit 130 includes transistors 116 and 117 functioning as a voltage application circuit used for performing the trimming, as well as the sense amplifier circuit 110. Note that, in the second embodiment, the sense amplifier circuit 10, the first circuit 30 and the inverting circuit 50 shown in FIG. 1A corresponds to the sense amplifier circuit 110, the first circuit 130 and the inverting circuit 150.

Although FIG. 4 illustrates only one bit line pair, the number of bit line pairs, and the number of the sense amplifier circuit 110 is not limited to this. As shown in FIG. 4, the sense amplifier circuit 110 and the inverting circuit 150 are connected in common to the bit line pair 120 (the bit line BL[m] and the bit line BL[m+1]). This is the same as the first embodiment.

The sense amplifier circuit includes a latch circuit. The latch circuit includes inverters 111 and 112. These inverters are connected in a cross-coupling manner at the nodes N50 and N60. The inverter 111 is formed by connecting a pMOS transistor 111A and an nMOS transistor 111B so that their current paths are connected in series. In addition, these transistors have commonly-connected gates. The inverter 112 is formed by connecting a pMOS transistor 112A and an nMOS transistor 112B so that their current paths are connected in series. In addition, these transistors have commonly-connected gates.

A pMOS transistor 113 is connected between the node N50 and the bit line BL[m] so that its current path is formed serially therebetween. Moreover, a pMOS transistor 114 is connected between the node N60 and the bit line BL [m+1] so that its current path is formed serially therebetween.

An nMOS transistor 115 is connected between sources of the nMOS transistors 111B and 112B and the ground terminal so that its current path is formed serially therebetween. The nMOS transistors 111B and 112B are included in the inverters 111 and 112, respectively. Moreover, the nodes N50 and N60 are connected to the drains of the pMOS transistors 116 and 117. The pMOS transistors 116 and 117 are made conductive when hot carrier is to be generated in the nMOS transistors 111B and 112B. These transistors 111B and 112B are included in the inverters 111 and 112 in the sense amplifier circuit 110.

The pMOS transistors 116 and 117 have respective sources that are connected to a power source 118. The power source 118 supplies a high voltage VCC3 (1.4 V) necessary for generating hot carrier. The pMOS transistors 113 and 114 have respective gates connected to a signal line XFB to which a voltage for turning on the pMOS transistors 113 and 114 when offset information of the sense amplifier circuit 110 is to be obtained.

A signal line SAE is connected to the gate of the nMOS transistor 115. The signal line SAE is applied with a voltage for turning on the nMOS transistor 115 when the sense amplifier circuit 110 is lead to an active state.

Moreover, a precharge circuit 160 is provided for precharging the nodes N50 and N60, The precharge circuit 160 includes pMOS transistors 161 and 162. The pMOS transistor 161 has a drain connected to the node N50 and a source supplied with a power supply voltage. The pMOS transistor 162 has a drain connected to the node N60 and a source supplied with a power supply voltage. These pMOS transistors 161 and 162 have respective gates that are connected to the signal line PCG.

The signal line PCG is supplied with a voltage 0V at the time of pre-charge operation. Moreover, although the illustration is omitted, a precharge circuit for precharging the bit line pair 20 is separately provided.

The inverting circuit 150 includes a latch circuit 153. The latch circuit 153 includes inverters 151 and 152 that are connected in a cross-coupling manner at nodes N70 and N80. The inverter 151 is formed by connecting a pMOS transistor 151A and an nMOS transistor 151B so that their current paths are connected in series. The transistors 151A and 151B include respective gates connected to the node N80.

On the other hand, the inverter 152 is formed by connecting a pMOS transistor 152A and an nMOS transistor 152B so that their current paths are connected in series. The transistors 152A and 152B include respective gates connected to the node N70.

The nMOS transistor 151B included in the inverter 151 have a source connected to a drain of the nMOS transistor 154. The nMOS transistor 152B included in the inverter 152 have a source connected to a drain of the nMOS transistor 155. The sources of the nMOS transistors 154 and 155 are connected in common. Note that the common connection node is referred to as a node N90. In addition, an nMOS transistor 156 is connected between the node N90 and the ground terminal so that its current path is formed in serial.

The node N70 is connected to a drain of a pMOS transistor 157. The node N80 is connected to a drain of the transistor 158. Moreover, the pMOS transistors 157 and 158 have respective sources connected to a power source supplying a positive voltage.

The nMOS transistor 156 is turned on when the amplified signals generated on the bit line pair 120 by the sense amplifier circuit 110 is to be latched into the latch circuit 153. Moreover, the pMOS transistors 157 and 158 are turned on when the inverted signal as a inverted signal of the amplified signal that emerged on the bit line pair 120 is to be generated. The gates of the transistors 156-158 are connected to a signal line CAP. The signal line CAP is fed with an instructing signal for instructing data latch at the latch circuit 153 and for generating the inverted signal.

Moreover, the node N70 is connected to a gate of the pMOS transistor 117, while the node N80 is connected to a gate of the pMOS transistor 116. Since the complementary signal is stored at the nodes N70 and N80, data "H" is stored at one of them, while data "L" is stored at the other. Therefore, either one of the pMOS transistor 116 or 117 is turned on.

[Operation of Second Embodiment]

Next, an operation of SRAM according to the second embodiment is described with reference to FIG. 6. Herein, operation for conducting trimming of the sense amplifier circuit 110 is described with reference to FIG. 6.

Figure 6:
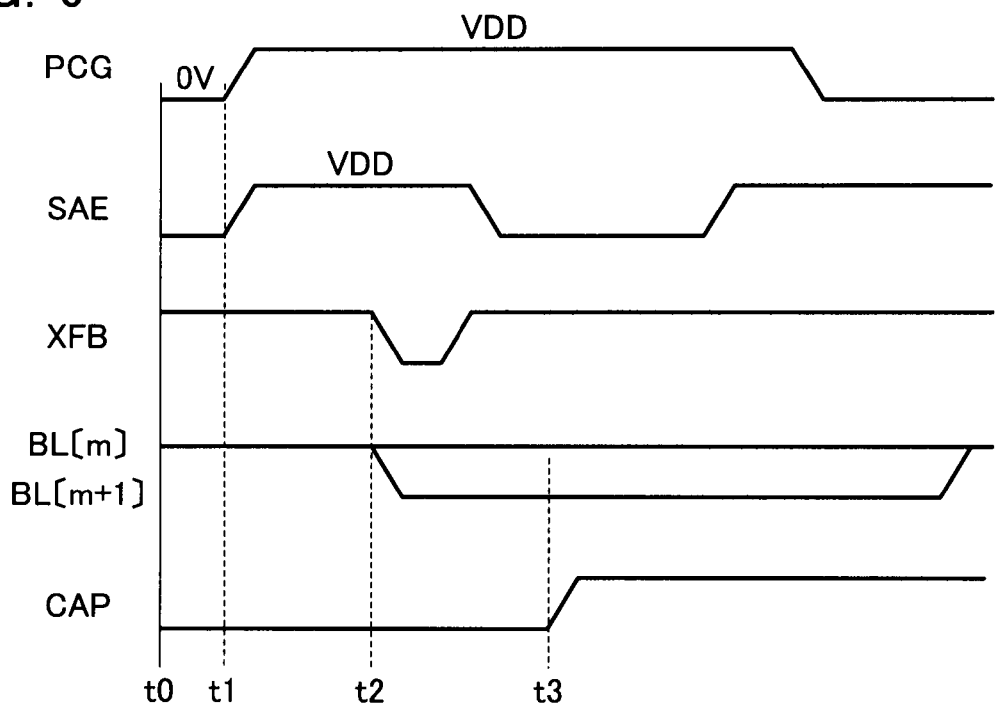
FIG. 6 is a timing chart of the trimming process of the sense amplifier circuit in the SRAM according to the second embodiment of the present invention.
Figure 7:
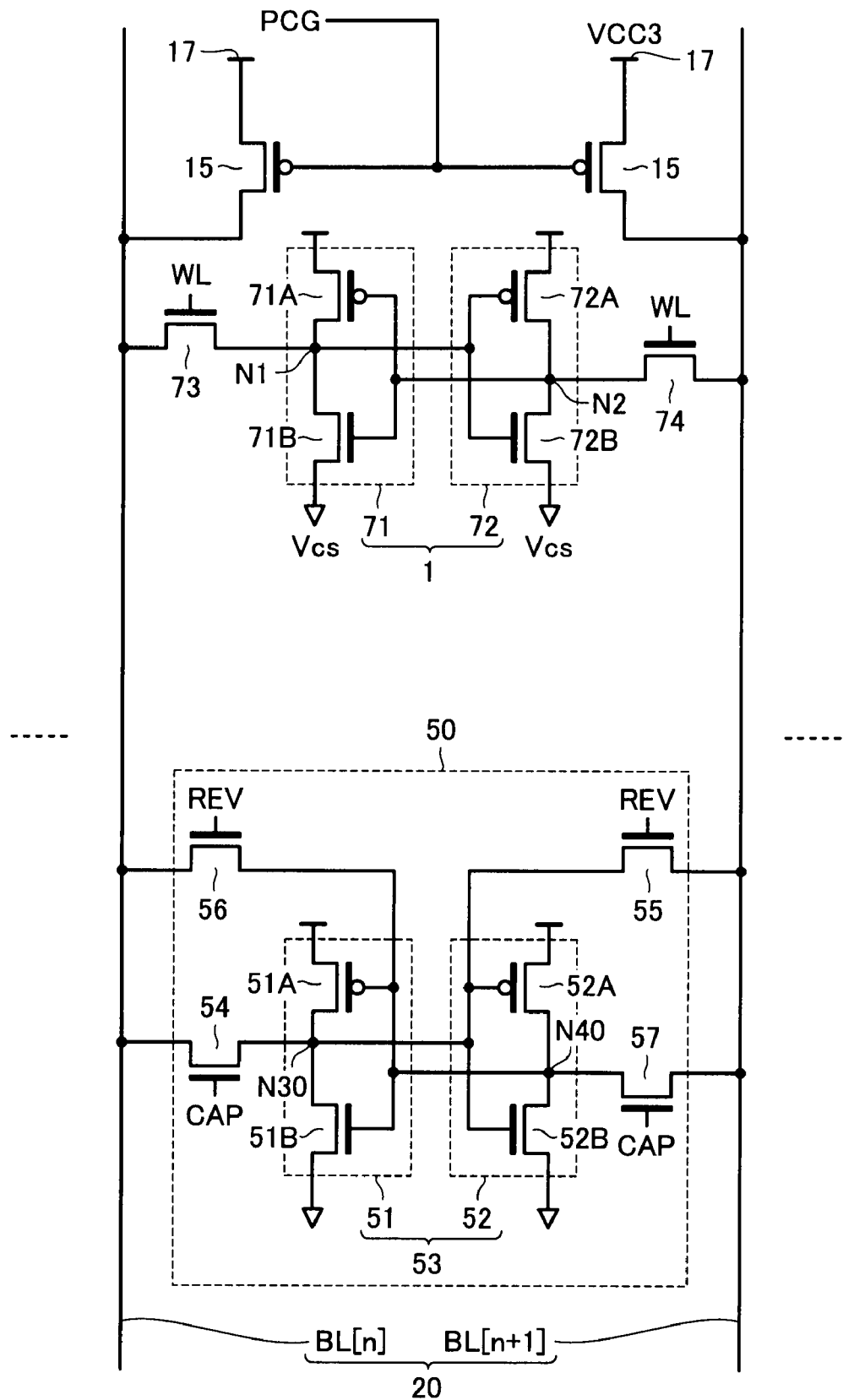
FIG. 7 illustrates a memory cell 1 in the SRAM and a inverting circuit 50 according to the third embodiment of the present invention.

FIG. 6 is a flowchart showing an example of the trimming method of the sense amplifier circuit 110 in the SRAM, and FIG. 7 is a timing chart showing each of the steps included therein. In this example explained below, a threshold voltage of the nMOS transistor 111B included in the inverter 11 is small, and, therefore, hot carrier is generated at the nMOS transistor 111B to adjust the threshold voltage thereof.

In a trimming method of the sense amplifier circuit 110, a voltage of the signal line PCG is set at 0V at the time t0, for acquiring offset information of the sense amplifier circuit 110. This allows the nodes N50 and N60 to be precharged to a certain electric potential. In addition, a precharge circuit (not illustrated) applies the voltage VDD to the bit line pair 120 (Step S201).

At the time t1, the voltage VDD is applied to the signal line SAE for activating the sense amplifier circuit 110, and the voltage of the signal line PCG is switched from 0V to the voltage VDD. This terminates the precharge operation.

Then, at the time t2, a voltage of 0V is applied to the signal line XFB to apply the voltage VDD to the sense amplifier circuit 110 (Step S202). Then the nMOS transistor 111B becomes a conductive state by the voltage VDD, thereby offset information "0" being acquired at the node N50, while offset information "1" is acquired at the node N60.

Moreover, offset information "0" is output to the bit line BL[m], and offset information "1" is output to the bit line BL[m+1] (Step S203).

Then, at the time t3, the voltage VDD is applied to the signal line CAP to allow the inverting circuit 150 to capture the offset information that has been output to the bit line pair 120 (Step S204). Then data "1" is transferred to the node N70, while data "0" is transferred to node N80. This makes the pMOS transistor 116 be conductive, while the pMOS transistor 117 is kept in a non-conductive state.

Then, the nMOS transistor 111B that holds offset information "0" is applied with the voltage VCC3 (1.4 V) at its drain. Also, the nMOS transistor 111B is applied with a voltage 0V at its gate electrode. On the contrary, the nMOS transistor 112B that holds offset information of "1" is not applied with the voltage VCC3 at its drain, since the pMOS transistor 117 is in a non-conductive state. Consequently, hot carrier is injected only to a gate insulating film of the nMOS transistor 111B that holds offset information of "0" (Step S205).

In this second embodiment, it is possible to apply a high voltage VCC3 for generating hot carrier only at the nMOS transistor 111B that holds offset information of "0". Accordingly, it is possible to reduce power consumption than the first embodiment.

Returning to Step S201 is repeated for a predetermined number of times, and the same steps are repeated for a predetermined number of times. If the predetermined number of times is finished, the trimming processing is finished (Step S206).

By performing the above-described process, hot carrier is injected only to the gate oxide of the nMOS transistor 111B that holds offset information of "0", i.e., the nMOS transistor 111B having a smaller threshold voltage. Injecting hot carrier into the gate oxide film raises the threshold voltage of the transistor. This may reduce the variation of the threshold voltages of the nMOS transistor 111B included in the inverter 111 and the nMOS transistor 112B included in the inverter 112.

Third Embodiment

Next, a third embodiment of the present invention is described with reference to FIG. 7. FIG. 7 is a circuit diagram showing the configuration of SRAM according to the third embodiment of the present invention. In this embodiment, the offset of the latch circuit comprising the memory cell 1 is trimmed. This is different from the above-mentioned first embodiment that performs trimming of the sense amplifier circuit.

The structure of the pMOS transistor 15 included in the voltage application circuit and the inverting circuit 50 is similar to the first embodiment. That is, inverting circuit 50 in this embodiment is configured to provide a transistor in a latch circuit included in the memory cell 1 with the inverted data. The same reference numerals are used for the other elements that are the same as those in the above described embodiments, and detailed descriptions thereof are omitted hereinbelow.

As shown in FIG. 7, the memory cell 1 comprises inverters 71 and 72 that are connected in a cross-coupling manner at nodes N1 and N2. The inverter 71 comprises a pMOS transistor 71A and an nMOS transistor 71B connected to each other so that their current paths are connected in serial, with their gates being commonly connected. The inverter 72 comprises a pMOS transistor 72A and an nMOS transistor 72B connected to each other so that their current paths are connected in serial, with their gates being commonly connected.

Moreover, transfer transistors 73 and 74 are connected between the bit line pairs 20 comprising the bit line BL [n] and the bit line BL [n+1] and the nodes N1 and N2, respectively. The Word line WL is connected to gates of the transfer transistors 73 and 74. Note that signal line Vcs is connected to sources of the nMOS transistors 71B and 72B.

Offset information of the memory cell 1 may be acquired by controlling the voltage of the signal line Vcs using a control circuit not shown.

Next, operation of the SRAM according to the third embodiment is described with reference to FIG. 8.

Figure 8:
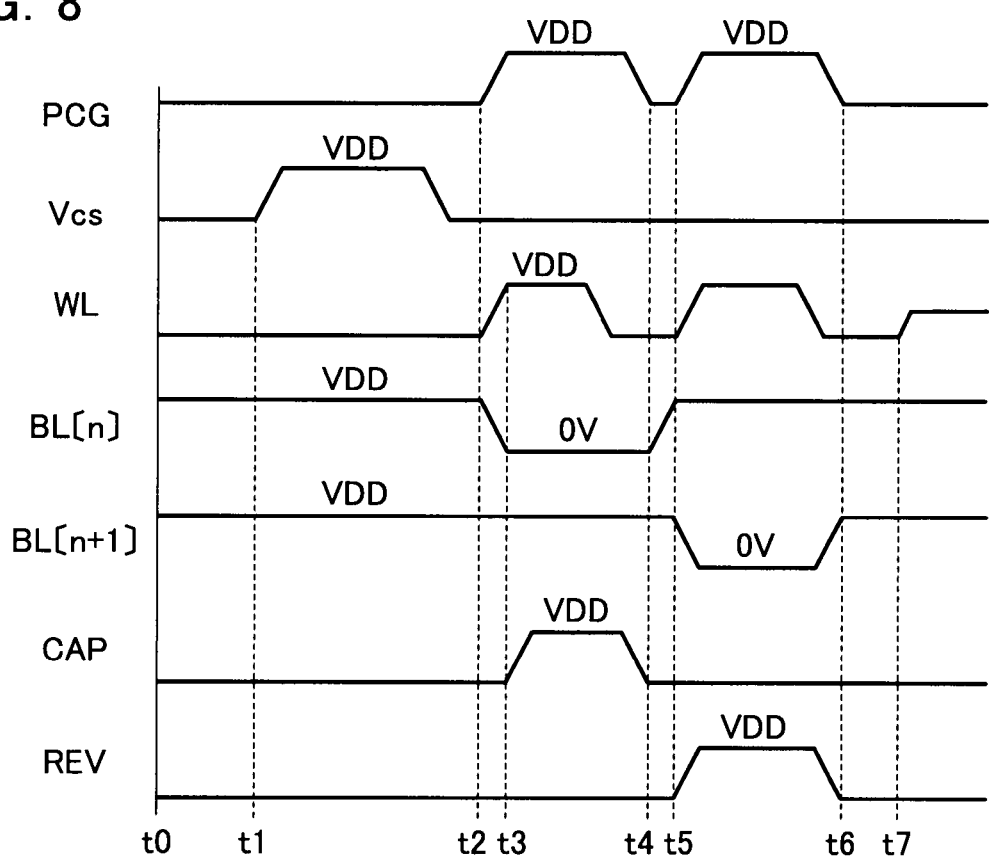
FIG. 8 is a timing-chart of the trimming process of the memory cell in the SRAM according to the third embodiment of the present invention.

FIG. 8 is a timing chart showing as an example a trimming method of the memory cell 1. In the following example, a threshold voltage of the nMOS transistor 71B included in the inverter 71 is small, and hot carrier is generated in this nMOS transistor 71B, thereby threshold voltage thereof being adjusted.

At first, at the time t0, in order to acquire offset information of the sense amplifier, the voltage of the signal line PCG is set at 0V. This allows the pMOS transistor 15 to turn on, and the voltage VDD is applied to the bit line pair 20 (the bit line BL [n] and BL [n+1]

Then, the voltage of the signal line Vcs is raised from 0V to the power supply voltage VDD between time t1 and t2. This generates complementary electric potentials at the nodes N1 and N2, due to the characteristic variation such as threshold voltages of the transistors 71A, 71B, 72A, 72B included in the memory cell 1.

When a threshold voltage of the nMOS transistor 71B is smaller than those of others, offset information "0" is acquired at the node N1, while offset information "1" is acquired at the node N2. Then, offset information "0" is output to the bit line BL [n], while offset information "1" (the voltage VDD) is output to the bit line BL [n+1].

Then, at the time t2, the voltage of the signal line PCG is set at the voltage VDD. and precharge operation of the bit line pair 20 is finished. Also, the voltage VDD is applied to the word line WL to capture the offset information at bit line pair 20. In this case, the voltage of the bit line BL [n] becomes 0V, and the voltage of the bit line BL [n+1] is kept at the voltage VDD.

Subsequently, at the time t3, the voltage of the signal line CAP is raised from 0V to the voltage VDD. This allows the voltage of the bit line pair 20 or the offset information to be captured at the inverting circuit 50. If the offset information is captured at the inverting circuit 50, application of the voltage VDD to the signal line CAP is terminated.

Then, the offset information supplied to the inverting circuit 50 is inverted, and the inverted data (an inverted signal or offset information) is generated. In this way, the inverted data is generated at the inverting circuit 50. Thereafter, at the time t4, the voltage of the signal line PCG is returned from the voltage VDD to 0V. This allows the bit line pair 20 to be precharged up to the voltage VDD.

Then, at the time t5, in order to output the inverted data held in the inverting circuit 50 to the bit line pair 20, the voltage VDD is applied to the signal line REV, while the voltage of the word line WL is set at the voltage VDD. This allows the inverted data (offset information) that has been output to the bit line pair 20 to be transferred to the nodes N1 and N2 in the memory cell 1, and data stored in the memory cell 1 is thereby rewritten.

In addition, at the time t6, the voltage of the word line WL is returned to 0V, and the voltage of the signal line PCG is set at 0V to precharge the bit line pair 20 up to the voltage VDD again.

Thereafter, the voltage of the word line WL is raised to a voltage VDD/2 at the time t7. Then, the transistor 71B with a low threshold voltage is applied with a drain-source voltage of VDD, and a gate-source voltage of Vdd/2. This generates hot carrier at the transistor 71B, and a threshold voltage thereof is thereby adjusted.

Having now described exemplary embodiments of the present invention, it is to be understood that various modifications, additions, substitutions and deletions of the described embodiments may be implemented, without departing from the spirit of the present invention.

What is claimed is:

1. A semiconductor integrated memory circuit, comprising:
   a bit line pair comprising a first bit line and a second bit line;
   a first latch circuit including first and second inverters connected in a cross-coupling manner at a first node and a second node;
   an inverting circuit operative to generate inversion signals as inverted signals of amplified signals, the amplified signals being provided from the first latch circuit to the bit line pair; and
   a voltage application circuit operative to provide the inversion signals from the inverting circuit to the first node and the second node, thereby applying apply a hot carrier generation voltage for generating hot carrier at a transistor included in the first inverter or the second inverter.

2. The semiconductor integrated memory circuit according to claim 1, wherein
   the voltage application circuit applies the hot carrier generation voltage to a transistor included in the first inverter or the second inverter to which the inversion signals are applied.

3. The semiconductor integrated memory circuit according to claim 1, wherein
   the voltage application circuit applies the hot carrier generation voltage to a transistor included in either the first inverter or the second inverter.

4. The semiconductor integrated memory circuit according to claim 1,
   wherein the voltage application circuit includes
   a first transistor having a first main electrode connected to the first node and a second main electrode connected to a power source that supplies the hot carrier generation voltage, and
   a second transistor having a first main electrode connected to the second node and a second main electrode connected to a power source that supplies the hot carrier generation voltage.

5. The semiconductor integrated memory circuit according to claim 1, further comprising an amplified signal capturing transistor connected between the inverting circuit and the bit line pair and configured to turn on when the amplified signals are supplied to the inverting circuit.

6. The semiconductor integrated memory circuit according to claim 5, further comprising an inversion signal capturing transistor connected between the inverting circuit and the bit line pair and configured to turn on when the inversion signals are supplied to the first node or the second node.

7. The semiconductor integrated memory circuit according to claim 1, wherein the inverting circuit includes:
a second latch circuit including third and fourth inverters connected in a cross-coupling manner at a third node and a fourth node;
a capture circuit comprising a first transistor and a second transistor, the first transistor having a second main electrode connected to the third node, and a first main electrode connected to the first bit line, the second transistor having a second main electrode connected to the fourth node, and a first main electrode connected to the second bit line, the capture circuit being configured to connect the third node and the fourth node with the bit line pair to capture the amplified signals at the second latch circuit; and
a reverse circuit comprising a third transistor and a fourth transistor, the third transistor having a second main electrode connected to the fourth node, and a first main electrode connected to the first bit line, the fourth transistor having a second main electrode connected to the third node, and a first main electrode connected to the second bit line, the reverse circuit being configured to connect the third node and the fourth node with the bit line pair to transfer the inversion signals to the bit line pair.

8. The semiconductor integrated memory circuit according to claim 1, wherein
the first latch circuit comprises a sense amplifier circuit for detecting and amplifying a signal read in the bit line pair from an SRAM cell.

9. The semiconductor integrated memory circuit according to claim 8, wherein the voltage application circuit applies the hot carrier generation voltage to a transistor included in the first inverter or the second inverter.

10. The semiconductor integrated memory circuit according to claim 8, wherein the voltage application circuit selectively applies the hot carrier generation voltage to either a transistor included in the first inverter or the second inverter.

11. The semiconductor integrated memory circuit according to claim 8, wherein the voltage application circuit comprises:
a first transistor including a first main electrode connected to the first node and a second main electrode connected to a power source supplying the hot carrier generation voltage; and
a second transistor having a first main electrode connected to the second node and a second main electrode connected to a power source supplying the hot carrier generation voltage.

12. The semiconductor integrated memory circuit according to claim 8, further comprising an amplified signal capturing transistor connected between the inverting circuit and the bit line pair and configured to turn on when the amplified signals are supplied to the inverting circuit.

13. The semiconductor integrated memory circuit according to claim 12, further comprising an inversion signal capturing transistor connected between the inverting circuit and the bit line pair and configured to turn on when the inversion signals are supplied to the first node or the second node.

14. The semiconductor integrated memory circuit according to claim 1, wherein the first latch circuit is an SRAM cell.

15. The semiconductor integrated memory circuit according to claim 14, further comprising a transfer transistor connected between the first node or the second node and the first bit line, and configured to turn on when a certain voltage is supplied to a word line.

16. The semiconductor integrated memory circuit according to claim 1,
wherein the voltage application circuit includes:
a first transistor having a first main electrode connected to the first node and a second main electrode connected to the first bit line;
a second transistor having a first main electrode connected to the second node and a second main electrode connected to the second bit line;
a third transistor having a first main electrode connected to the first node, a second main electrode connected to a power source supplying the hot carrier generation voltage, and a gate connected to the inverting circuit; and
a fourth transistor having a first main electrode connected to the second node and a second main electrode connected to a power source supplying the hot carrier generation voltage, and a gate connected to the inverting circuit.

17. The semiconductor integrated memory circuit according to claim 1, wherein the inverting circuit includes:
a second latch circuit including third and fourth inverters connected in a cross-coupling manner at a third node and a fourth node; and
an inversion signal generation circuit configured to connect one end of the third inverter and the fourth inverter with the bit line pair to generate the inversion signals at the second latch circuit,
the third inverter comprises a first transistor and a second transistor connected to each other with their current paths being connected in series,
the fourth inverter comprises a third transistor and a fourth transistor connected to each other with their current paths being connected in series,
the inversion signal generation circuit includes:
a fifth transistor having a gate connected to the first bit line, and a first main electrode connected to a second main electrode of the second transistor;
a sixth transistor having a gate connected to the second bit line, and a first main electrode connected to a second main electrode of the fourth transistor;
a seventh transistor having a first main electrode connected to the third node, and a second main electrode connected to a power source supplying a positive voltage; and
an eighth transistor having a first main electrode connected to the fourth node, and a second main electrode connected to a power source supplying a positive voltage.

18. The semiconductor integrated memory circuit according to claim 17, wherein the voltage application circuit includes:
a ninth transistor having a gate and configured to turn on when the gate is provided with a voltage on the first node to supply the hot carrier generation voltage to the second node; and
a tenth transistor having a gate and configured to turn on when the gate is provided with a voltage on the fourth node to supply the hot carrier generation voltage to the first node.

19. A method of trimming a latch circuit in a semiconductor integrated memory circuit, the latch circuit including first and second inverters connected in a cross-coupling manner at a first node and a second node, the method comprising:
generating, with an inverting circuit, inversion signals by inverting amplified signals supplied from the latch circuit to a bit line pair;
supplying the inversion signals from the inverting circuit to the first node and the second node, thereby applying a hot-carrier generation signal for generating hot carrier in a transistor included in the latch circuit.

* * * * *